United States Patent
Wolf et al.

(10) Patent No.: US 9,648,740 B2
(45) Date of Patent: May 9, 2017

(54) CERAMIC SUBSTRATE INCLUDING THIN FILM MULTILAYER SURFACE CONDUCTOR

(71) Applicant: Honeywell Federal Manufacturing & Technologies, LLC, Kansas City, MO (US)

(72) Inventors: Joseph Ambrose Wolf, Kansas City, MO (US); Kenneth A. Peterson, Albuquerque, NM (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 89 days.

(21) Appl. No.: 14/502,745

(22) Filed: Sep. 30, 2014

(65) Prior Publication Data

US 2015/0090478 A1   Apr. 2, 2015

Related U.S. Application Data

(60) Provisional application No. 61/884,522, filed on Sep. 30, 2013.

(51) Int. Cl.
  *H05K 3/46* (2006.01)
  *H05K 1/11* (2006.01)
(52) U.S. Cl.
  CPC ........... *H05K 1/115* (2013.01); *H05K 3/4629* (2013.01); *H05K 2201/0338* (2013.01)
(58) Field of Classification Search
  None
  See application file for complete search history.

(56) References Cited

U.S. PATENT DOCUMENTS

| | | | | |
|---|---|---|---|---|
| 3,811,937 A | * | 5/1974 | Maher | C03C 3/066 361/320 |
| 4,567,542 A | * | 1/1986 | Shimada | H05K 3/4611 257/532 |
| 4,745,670 A | * | 5/1988 | Morris | B23P 15/16 205/75 |
| 4,871,608 A | * | 10/1989 | Kondo | C03C 17/008 106/1.13 |
| 5,446,246 A | * | 8/1995 | Desai | H01L 23/49827 174/262 |

(Continued)

*Primary Examiner* — Jeremy C Norris
*Assistant Examiner* — Muhammed Azam
(74) *Attorney, Agent, or Firm* — Hovey Williams LLP

(57) ABSTRACT

A ceramic substrate comprises a plurality of ceramic sheets, a plurality of inner conductive layers, a plurality of vias, and an upper conductive layer. The ceramic sheets are stacked one on top of another and include a top ceramic sheet. The inner conductive layers include electrically conductive material that forms electrically conductive features on an upper surface of each ceramic sheet excluding the top ceramic sheet. The vias are formed in each of the ceramic sheets with each via being filled with electrically conductive material. The upper conductive layer includes electrically conductive material that forms electrically conductive features on an upper surface of the top ceramic sheet. The upper conductive layer is constructed from a stack of four sublayers. A first sublayer is formed from titanium. A second sublayer is formed from copper. A third sublayer is formed from platinum. A fourth sublayer is formed from gold.

15 Claims, 4 Drawing Sheets

(56) References Cited

U.S. PATENT DOCUMENTS

| | | | | |
|---|---|---|---|---|
| 5,525,402 A * | 6/1996 | Nakamura | H01L 21/4853 | 428/131 |
| 5,869,899 A * | 2/1999 | Arledge | H01L 21/4846 | 257/697 |
| 6,072,690 A * | 6/2000 | Farooq | H01G 4/30 | 257/E23.067 |
| 6,217,989 B1 * | 4/2001 | Brody | H01L 23/49827 | 174/261 |
| 6,408,511 B1 * | 6/2002 | Branchevsky | H01L 21/4853 | 29/825 |
| 2001/0023779 A1 * | 9/2001 | Sugaya | H05K 1/16 | 174/255 |
| 2001/0026435 A1 * | 10/2001 | Sakai | H01L 23/5384 | 361/306.3 |
| 2002/0094423 A1 * | 7/2002 | Ogura | B32B 18/00 | 428/210 |
| 2002/0098330 A1 * | 7/2002 | Masuko | C03C 14/004 | 428/209 |
| 2002/0170901 A1 * | 11/2002 | Lau | H01L 23/345 | 219/209 |
| 2004/0091719 A1 * | 5/2004 | Uchida | H05K 1/0274 | 428/429 |
| 2004/0136169 A1 * | 7/2004 | Morimoto | H05K 1/023 | 361/780 |
| 2004/0148765 A1 * | 8/2004 | Casey | H01L 21/4846 | 29/829 |
| 2004/0173879 A1 * | 9/2004 | Ohta | H01L 23/66 | 257/664 |
| 2006/0051253 A1 * | 3/2006 | Gausepohl | B01L 9/52 | 422/504 |
| 2007/0000970 A1 * | 1/2007 | Sugahara | H01L 21/486 | 228/101 |
| 2007/0060970 A1 * | 3/2007 | Burdon | A61N 1/3754 | 607/37 |
| 2007/0176302 A1 * | 8/2007 | Lee | H01L 23/15 | 257/782 |
| 2007/0235694 A1 * | 10/2007 | Nair | H01B 1/22 | 252/500 |
| 2009/0133917 A1 * | 5/2009 | Horiuchi | H01L 23/49822 | 174/261 |
| 2009/0166068 A1 * | 7/2009 | Takahashi | H05K 1/113 | 174/258 |
| 2009/0170032 A1 * | 7/2009 | Takahashi | H01F 41/041 | 430/312 |
| 2009/0200067 A1 * | 8/2009 | Nozu | G01R 1/07378 | 174/255 |
| 2009/0321114 A1 * | 12/2009 | Takahashi | G01R 3/00 | 174/257 |
| 2010/0230148 A1 * | 9/2010 | Kariya | H01L 23/13 | 174/258 |
| 2010/0243299 A1 * | 9/2010 | Kariya | H01L 21/486 | 174/255 |
| 2010/0300733 A1 * | 12/2010 | Kim | C04B 37/006 | 174/257 |
| 2011/0057678 A1 * | 3/2011 | Kato | C03C 14/004 | 324/756.03 |

* cited by examiner

CERAMIC SUBSTRATE INCLUDING THIN FILM MULTILAYER SURFACE CONDUCTOR

RELATED APPLICATION

The current non-provisional patent application claims priority benefit, with regard to all common subject matter, of an earlier-filed U.S. provisional patent application titled "SILVER THICK FILM PASTE HERMETICALLY SEALED BY SURFACE THIN FILM MULTILAYER", Application Ser. No. 61/884,522, filed Sep. 30, 2014. The earlier-filed application is hereby incorporated by reference into the current application in its entirety.

GOVERNMENT LICENSE RIGHTS UNDER FEDERALLY SPONSORED RESEARCH AND DEVELOPMENT

This invention was developed with government support under Contract DE-NA0000622 with Honeywell Federal Manufacturing & Technologies, LLC and the U.S. Department of Energy, and under Contract DE-AC04-94AL85000 between Sandia Corporation and the U.S. Department of Energy. The U.S. Government has certain rights in this invention.

BACKGROUND OF THE INVENTION

Field of the Invention

Embodiments of the current invention relate to ceramic substrates in general and to a conductive layer on an upper surface of a ceramic substrate in particular.

Description of the Related Art

Ceramic substrates, such as low-temperature cofired ceramic (LTCC) substrates, often comprise a stack of ceramic material sheets and conductive layers, with each conductive layer positioned between two adjacent ceramic sheets. Typically, conductive traces or interconnects as well as passive electronic components, such as resistors, capacitors, and inductors, are formed on one or more conductive layers. Furthermore, vias, including thermal and stacked vias, may extend through the ceramic sheets to connect the conductive layers. The conductive layers and the vias are typically constructed from a thick film paste made from silver (Ag). While silver is less expensive to use and offers very good electrical performance, particularly in the radio frequency (RF) band, silver has significant drawbacks when used as the conductive layer on the upper surface of the ceramic substrate. For example, silver has inferior chemical properties which can lead to the formation of oxides on the conductive layer and inferior mechanical properties which can lead to migration that forms electrical-short causing whiskers.

SUMMARY OF THE INVENTION

Embodiments of the current invention solve the above-mentioned problems and provide a distinct advance in the art of forming a conductive layer on an upper surface of a ceramic substrate. More particularly, embodiments of the invention provide a ceramic substrate with a multilayer metal stack which serves as the conductive layer on the upper surface of the ceramic substrate. The multilayer metal stack does not form oxides or whiskers.

An embodiment of the ceramic substrate comprises a plurality of ceramic sheets, a plurality of inner conductive layers, a plurality of vias, and an upper conductive layer. The ceramic sheets are stacked one on top of another and include a top ceramic sheet. The inner conductive layers include electrically conductive material that forms electrically conductive features on an upper surface of each ceramic sheet excluding the top ceramic sheet. The vias are formed in each of the ceramic sheets with each via being filled with electrically conductive material. The upper conductive layer includes electrically conductive material that forms electrically conductive features on an upper surface of the top ceramic sheet. The upper conductive layer is constructed from a stack of four sublayers. A first sublayer may be formed from titanium, a second sublayer may be formed from copper, a third sublayer may be formed from platinum, and a fourth sublayer may be formed from gold. The first sublayer contacts the upper surface of the top ceramic sheet and electrically connects to the vias in the top ceramic sheet. The fourth sublayer is configured to receive electrical connectors from electronic circuitry placed on the ceramic substrate.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 1:
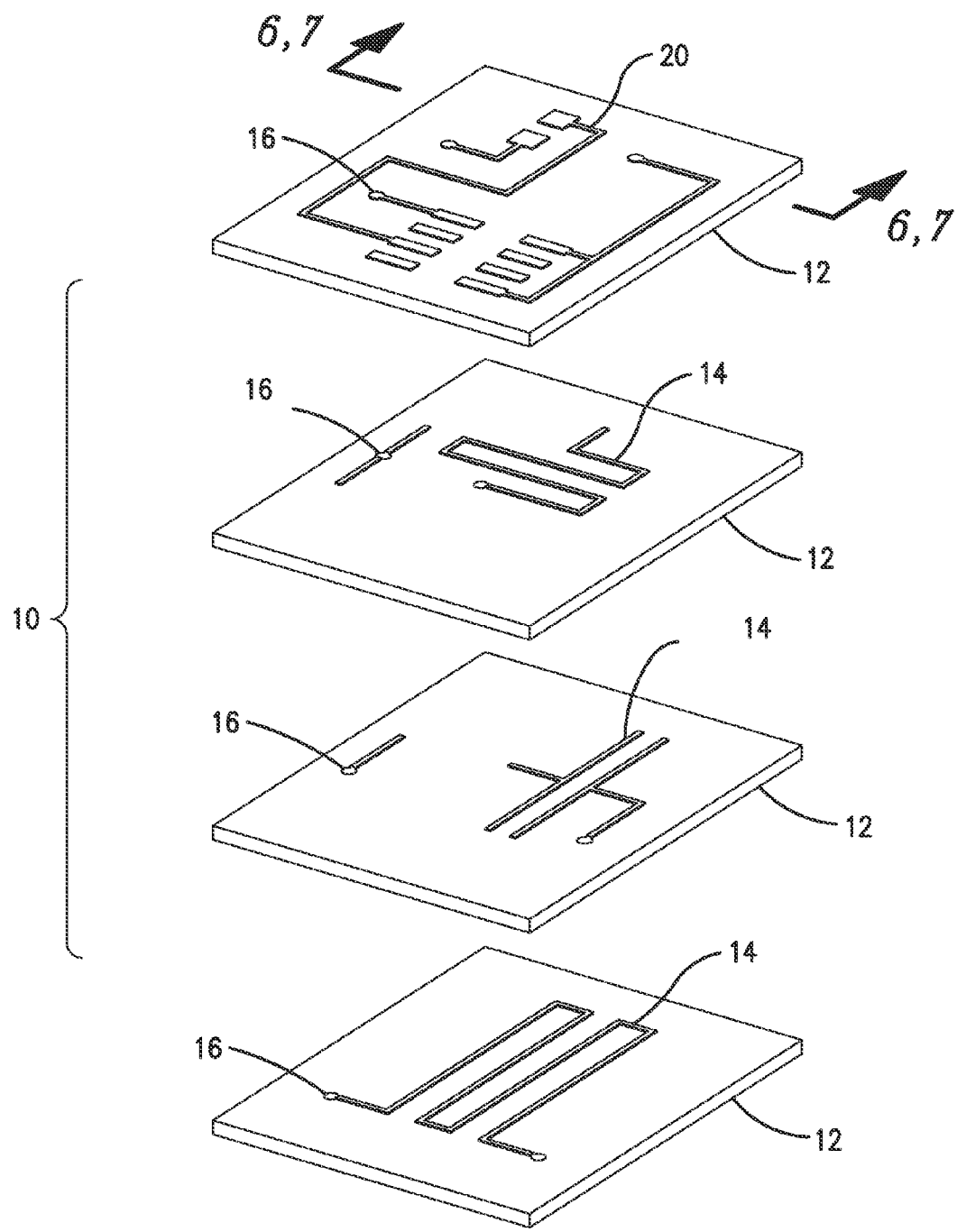
FIG. 1 is a perspective view of a ceramic substrate, constructed in accordance with various embodiments of the current invention, comprising a plurality of ceramic sheets and a plurality of conductive layers.

The drawing figures do not limit the current invention to the specific embodiments disclosed and described herein.

The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 2:
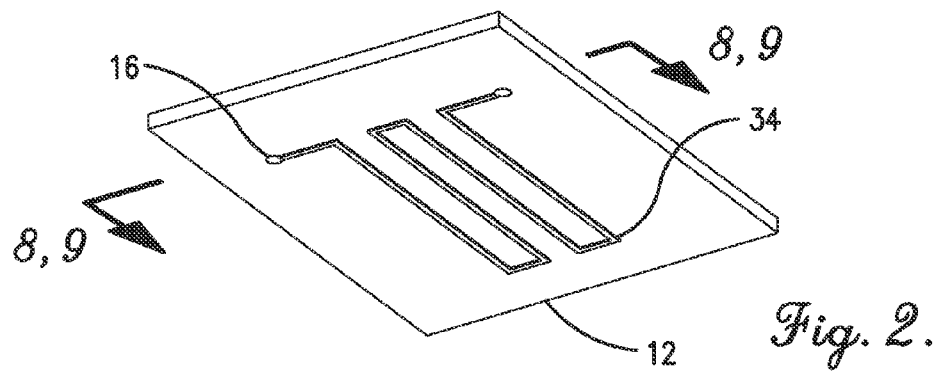
FIG. 2 is a perspective view of a lower surface of a bottom ceramic sheet illustrating a lower conductive layer.

A ceramic substrate 10, constructed in accordance with various embodiments of the current invention, is shown in FIGS. 1-5. The ceramic substrate 10 broadly comprises a plurality of ceramic sheets 12, a plurality of inner conductive layers 14, a plurality of vias 16, an optional plurality of caps 18, and an upper conductive layer 20. An optional lower conductive layer 34 is shown in FIG. 2.

In various embodiments, the ceramic substrate 10 may form or provide a substrate or a foundation for an electronic module 22 or package that includes electronic circuitry 24, wherein the electronic circuitry 24 is placed on an upper surface of the ceramic substrate 10. The electronic circuitry 24 may include analog, digital, or mixed-signal circuitry, RF circuits (particularly high frequency transmitters and receivers), other high performance circuits, or combinations thereof. In addition, the electronic circuitry 24 may be implemented as integrated circuits (ICs), such as bare die ICs with flip chip pads or wire bond pads, or as surface mount devices. Although not shown in the figures, the electronic module 22 may also include electronic circuitry 24 that is placed on and attached to a lower surface of the ceramic substrate 10. The ceramic substrate 10 may be a low temperature cofired ceramic (LTCC) substrate or a high temperature cofired ceramic (HTCC) substrate.

The ceramic sheets 12, as seen in FIGS. 1-3, 6, and 7, generally provide electric insulation, isolation, or dielectric functions. Typically, each ceramic sheet 12 is formed from ceramic-based ($Al_2O_3$) material, particularly ceramic or ceramic and glass material. An exemplary ceramic material, also known as green sheets or tape, may include 951 P2, PT, or PX Green Tape from DuPont of Wilmington, Del., the CT products from Heraeus of Conshohocken, Pa., the A6 or L8 products from Ferro of Vista, Calif. Ceramic tape and powder products from other manufacturers may also be used to form the ceramic sheets 12.

The inner conductive layers 14, shown in FIG. 1, generally provide electrical connection for the electronic circuitry 24 as well as passive electronic components. The electrical connection may include conductive traces and the passive electronic components may include resistors, capacitors, and inductors. The inner conductive layer 14 may be formed from metals typically used in the field of electronics, such as copper, aluminum, gold, platinum, nickel, titanium, and the like. An exemplary embodiment of the inner conductive layers 14 may be formed from silver, also known as Ag (silver) thick film paste. Each inner conductive layer 14 is formed on a surface of one of the ceramic sheets 12 typically by screen printing, such as screen printing using silver paste. The widths and thicknesses of the traces and other features of the inner conductive layers 14 may vary according to standard design rules.

Figure 6:
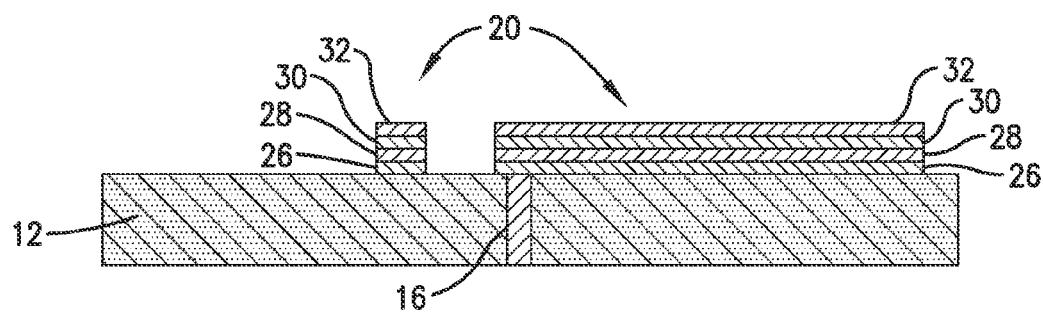
FIG. 6 is a sectional view of a top ceramic sheet, cut along line 6-6 in FIG. 1, with a via and an upper conductive layer including a multilayer thin film stack.
Figure 7:
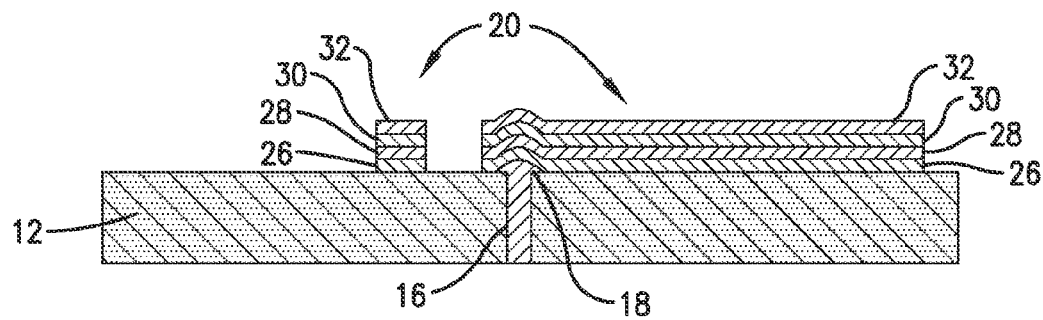
FIG. 7 is a sectional view of the top ceramic sheet, cut along line 7-7 in FIG. 1, with the via, the upper conductive layer, and a cap hermetically sealed by the upper conductive layer.

The vias 16, seen in FIGS. 1, 6, and 7, generally provide electrical connection from one conductive layer 14, 20 to one or more other conductive layers 14, 20. The vias 16 may also provide thermal conduction through one or more ceramic sheets 12. The vias 16 are typically formed from the same metal that is used for the conductive layers 14, 20. Each via 16 may be formed by creating a hole in one or more ceramic sheets 12, such as by punching, and then filling the one or more holes with conductive material, such as silver paste. The diameters of the vias 16 may vary according to standard design rules.

The caps 18, as seen in FIGS. 6 and 7, generally provide a cover for the vias 16 that connect with the upper surface of the ceramic substrate 10. Each cap 18 may be placed on the hole that forms the via 16 to be covered. Typically, the diameter of the cap 18 is larger than the diameter of the via 16. The thickness of the cap 18 may vary according to design rules with an exemplary thickness being approximately 12 micrometers ($\mu m$) that tapers at the edges. Each cap 18 may be formed from the same material as the vias 16 and the inner conductive layers 14, which is typically silver paste.

The upper conductive layer 20, shown in FIGS. 1 and 3-7, generally provides electrical connection including conductive traces and bonding pads on the upper surface of the ceramic substrate 10 for the electronic circuitry 24. Each conductive trace may connect one bonding pad to other bonding pads or to one or more vias 16. The trace of the upper conductive layer 20 may cover the caps 18 as well, if the caps 18 are utilized, as shown in FIG. 6. The bonding pads may be rectangular or square in shape and may be utilized for wire bonding or soldering. The electronic circuitry 24 may be attached to the upper surface of the ceramic substrate 10 with the bonding pads of the electronic circuitry 24 being connected to the bonding pads of the ceramic substrate 10.

The upper conductive layer 20 may include a one or more thin film conductive sublayers. In an exemplary embodiment, the upper conductive layer 20 may include four thin film sublayers. A first sublayer 26 may comprise titanium (Ti) to provide adhesion to the upper surface of the ceramic substrate 10 (which is also the top ceramic sheet 12), with the first sublayer 26 having a thickness ranging from 0 $\mu m$ to approximately 0.4 $\mu m$, with an exemplary thickness being approximately 0.2 $\mu m$. A second sublayer 28 may comprise copper (Cu) to provide good RF conductivity, with the second sublayer 28 having a thickness ranging from approximately 1 $\mu m$ to approximately 18 $\mu m$, with an exemplary thickness being approximately 4 $\mu m$. A third sublayer 30 may comprise platinum (Pt) to provide robust solder connectivity, with the third sublayer 30 having a thickness ranging from approximately 1 $\mu m$ to approximately 4 μm, with an exemplary thickness being approximately 2 μm. A fourth sublayer 32 may comprise gold (Au) for improved wire bonding connectivity, with the fourth sublayer 32 having a thickness ranging from approximately 0.1 μm to approximately 0.5 μm, with an exemplary thickness being approximately 0.375 μm. The titanium first sublayer 26, the platinum third sublayer 30, or both may also provide a barrier to diffusion of the metal, particularly silver, used for the vias 16 that connect to the upper surface of the ceramic substrate 10. The total thickness of the upper conductive layer 20 may be at least 2 μm, with an exemplary thickness of approximately 6.575 μm.

The upper conductive layer 20 may be formed as one or more layers of the sublayers 26, 28, 30, 32 discussed above, or as a stack with the sublayers in numerical order, including the first sublayer 26 on the bottom and the fourth sublayer 32 on the top, as seen in FIGS. 6 and 7. FIG. 6 shows the top ceramic sheet 12 with a via 16 and two portions of the upper conductive layer 20, wherein one portion of the upper conductive layer 20 covers and hermetically seals the via 16. FIG. 7 shows the top ceramic sheet 12 with a via 16, an optional cap 18, and two portions of the upper conductive layer 20, wherein one portion of the upper conductive layer 20 covers and hermetically seals the cap 18. The upper conductive layer 20 may be formed by deposition techniques such as electroplating, chemical vapor deposition (CVD), physical vapor deposition (PVD), including e-beam evaporation, thermal evaporation, sputtering, and the like.

Figure 8:
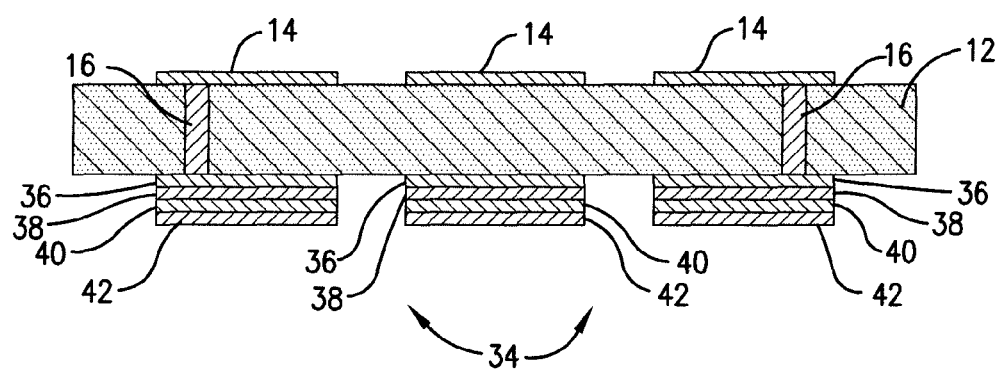
FIG. 8 is a sectional view of a bottom ceramic sheet, cut along line 8-8 in FIG. 2, with two vias and three portions of an upper conductive layer including a multilayer thin film stack.
Figure 9:
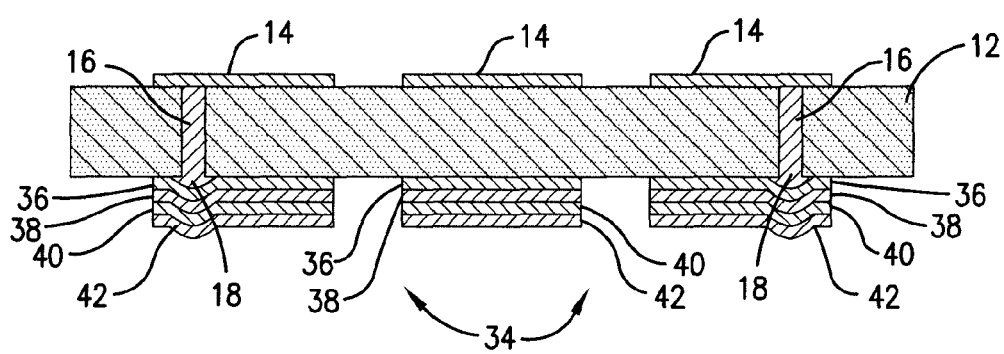
FIG. 9 is a sectional view of the bottom ceramic sheet, cut along line 9-9 in FIG. 2, with two vias, two caps, and three portions of the upper conductive layer.

The lower conductive layer 34, as seen in FIGS. 2, 8, and 9, may be substantially similar to the upper conductive layer 20, but may be formed on a lower surface of a bottom ceramic sheet 12. Like the upper conductive layer 20, the lower conductive layer 34 may include one or more of the following thin film sublayers: a first sublayer 36, a second sublayer 38, a third sublayer 40, and a fourth sublayer 42. The sublayers 36, 38, 40, 42 of the lower conductive layer 34 may be substantially similar in construction and function to the sublayers 26, 28, 30, 32 of the upper conductive layer 20. FIG. 8 shows the bottom ceramic sheet 12 with two vias 16 and three portions of the lower conductive layer 34. FIG. 9 shows the bottom ceramic sheet 12 with two vias 16, two optional caps 18, and three portions of the lower conductive layer 34, wherein two portions of the lower conductive layer 34 cover and hermetically seal the caps 18.

Figure 3:
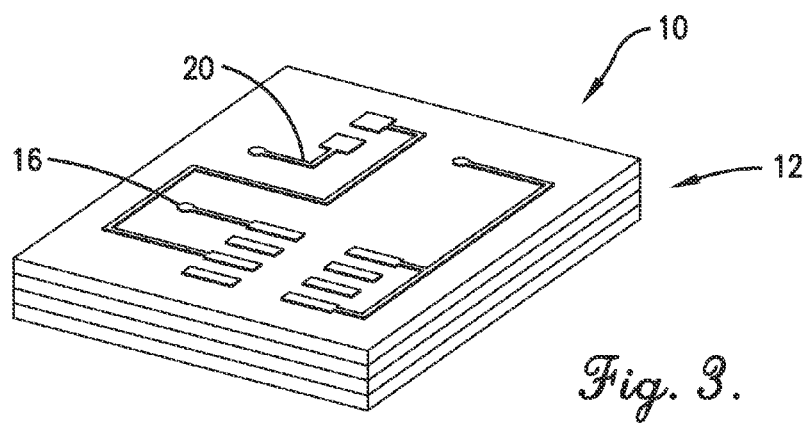
FIG. 3 is a perspective view of the ceramic substrate with the ceramic sheets stacked one on top of another.

The ceramic substrate 10 may be formed as follows. As seen in FIG. 1, the appropriate number of ceramic sheets 12 may be cut to size. Vias 16, as necessary, may be formed in each ceramic sheet 12 by punching or other techniques. The inner conductive layers 14 may be formed on each ceramic sheet 12, except for the top ceramic sheet 12, by screen printing using silver paste, or similar techniques. At the same time, the holes for the vias 16 may be filled with silver paste as well. The upper conductive layer 20 may be formed on the top ceramic sheet 12 with the first sublayer 26 being deposited first and the fourth sublayer 32 being deposited last. If utilized, the lower conductive layer 34 may be formed on the bottom ceramic sheet 12, seen in FIG. 2, with the first sublayer 36 being deposited first and the fourth sublayer 42 being deposited last. The ceramic sheets 12 may be aligned and stacked, as shown in FIG. 3. The ceramic substrate 10, shown after firing in FIGS. 4 and 5, may be formed by cofiring the ceramic sheets 12 and the conductive layers 14, 20 using known firing techniques.

Figure 4:
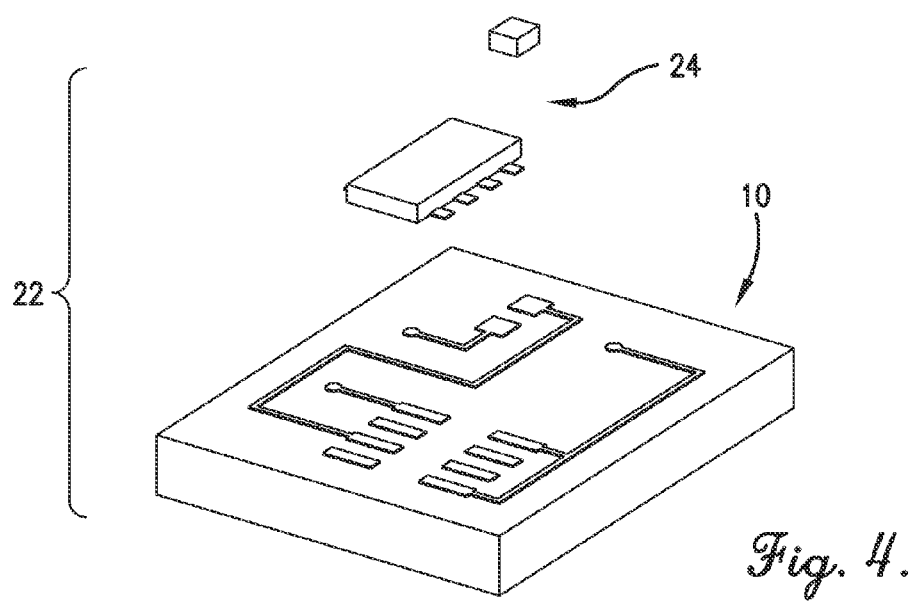
FIG. 4 is a perspective view of the ceramic substrate and electronic circuitry, wherein the ceramic substrate has been fired and the electronic circuitry is waiting to be attached and electrically connected thereto.
Figure 5:
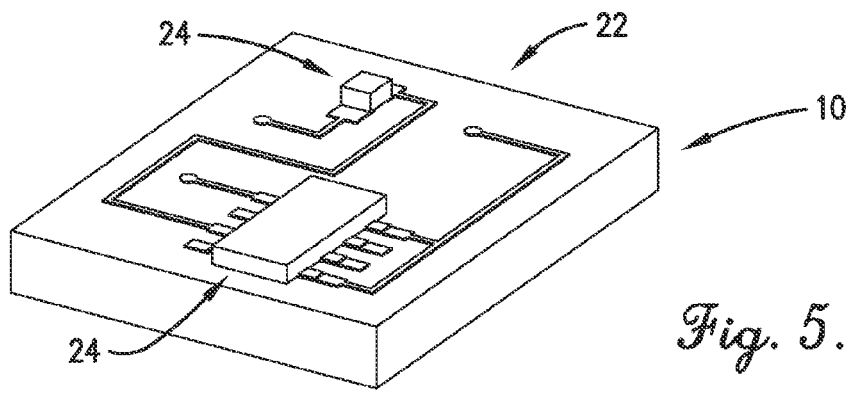
FIG. 5 is a perspective view of an electronic module comprising the ceramic substrate with the electronic circuitry connected thereto.

The electronic module 22, shown in FIGS. 4 and 5, may be formed by placing electronic circuitry 24 on the upper surface of the ceramic substrate 10. The conductive pads of the electronic circuitry 24 may be attached to bond pads on the upper surface of the ceramic substrate 10 with electrical connectors such as bond wires or solder using techniques such as solder bonding, bump bonding, wire bonding, or the like.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A ceramic substrate comprising:
   a plurality of ceramic sheets stacked one on top of another, the ceramic sheets including a top ceramic sheet;
   a plurality of inner conductive layers forming electrically conductive features on an upper surface of each ceramic sheet excluding the top ceramic sheet, each inner conductive layer formed from an electrically conductive material;
   a plurality of vias formed in each of the ceramic sheets, each via filled with the electrically conductive material;
   a plurality of caps positioned on the upper surface of the top ceramic sheet, each cap formed from the electrically conductive material, covering one via on the top ceramic sheet, and having a diameter greater than a diameter of the via; and
   an upper conductive layer forming electrically conductive features on an upper surface of the top ceramic sheet, the upper conductive layer constructed from one or more thin film sublayers.

2. A ceramic substrate comprising:
   a plurality of ceramic sheets stacked one on top of another, the ceramic sheets including a top ceramic sheet;
   a plurality of inner conductive layers forming electrically conductive features on an upper surface of each ceramic sheet excluding the top ceramic sheet, each inner conductive layer formed from an electrically conductive material;
   a plurality of vias formed in each of the ceramic sheets, each via filled with the electrically conductive material;
   a plurality of caps positioned on the upper surface of the top ceramic sheet, each cap formed from the electrically conductive material, covering one via in the top ceramic sheet, and having a diameter greater than a diameter of the via; and
   an upper conductive layer forming electrically conductive features on an upper surface of the top ceramic sheet, the upper conductive layer constructed from a stack of sublayers including:
      a first sublayer formed from titanium having a thickness ranging from 0 micrometers (μm) to 0.4 μm,
      a second sublayer formed from copper having a thickness ranging from 1 μm to 18 μm,
      a third sublayer formed from platinum having a thickness ranging from 1 μm to 4 μm, and
      a fourth sublayer formed from gold having a thickness ranging from 0.1 μm to 0.5 μm,
      wherein the first sublayer contacts the upper surface of the top ceramic sheet and hermetically seals the caps in the top ceramic sheet and the fourth sublayer is configured to receive electrical connectors from electronic circuitry placed on the ceramic substrate.

3. The ceramic substrate of claim 1, wherein the upper conductive layer covers and hermetically seals each cap.

4. The ceramic substrate of claim 1, wherein the one or more thin film sublayers includes a stack of sublayers including a first sublayer formed from titanium, a second sublayer formed from copper, a third sublayer formed from platinum, and a fourth sublayer formed from gold, wherein the first sublayer contacts the upper surface of the top ceramic sheet and electrically connects to the vias in the top ceramic sheet and the fourth sublayer is configured to receive electrical connectors from electronic circuitry placed on the ceramic substrate.

5. The ceramic substrate of claim 4, wherein the first sublayer has a thickness ranging from 0 micrometers (μm) to 0.4 μm.

6. The ceramic substrate of claim 4, wherein the second sublayer has a thickness ranging from 1 μm to 18 μm.

7. The ceramic substrate of claim 4, wherein the third sublayer has a thickness ranging from 1 μm to 4 μm.

8. The ceramic substrate of claim 4, wherein the fourth sublayer has a thickness ranging from 0.1 μm to 0.5 μm.

9. The ceramic substrate of claim 1, further comprising a lower conductive layer forming electrically conductive features on a lower surface of a bottom ceramic sheet, the lower conductive layer constructed from one or more thin film sublayers.

10. The ceramic substrate of claim 9, wherein the one or more thin film sublayers of the lower conductive layer includes a stack of sublayers including a first sublayer formed from titanium, a second sublayer formed from copper, a third sublayer formed from platinum, and a fourth sublayer formed from gold, wherein the first sublayer contacts the upper surface of the bottom ceramic sheet and electrically connects to the vias in the bottom ceramic sheet and the fourth sublayer is configured to receive electrical connectors from electronic circuitry placed on the bottom surface of the ceramic substrate.

11. A ceramic substrate comprising:
a plurality of ceramic sheets stacked one on top of another, the ceramic sheets including a top ceramic sheet;
a plurality of inner conductive layers forming electrically conductive features on an upper surface of each ceramic sheet excluding the top ceramic sheet, each inner conductive layer formed from an electrically conductive material;
a plurality of vias formed in each of the ceramic sheets, each via filled with the electrically conductive material;
a plurality of caps positioned on the upper surface of the top ceramic sheet, each cap formed from the electrically conductive material, covering one via in the top ceramic sheet, and having a diameter greater than a diameter of the via; and
an upper conductive layer forming electrically conductive features on an upper surface of the top ceramic sheet, the upper conductive layer constructed from a stack of sublayers including a first sublayer formed from titanium, a second sublayer formed from copper, a third sublayer formed from platinum, and a fourth sublayer formed from gold, wherein the first sublayer contacts the upper surface of the top ceramic sheet and hermetically seals the caps in the top ceramic sheet and the fourth sublayer is configured to receive electrical connectors from electronic circuitry placed on the ceramic substrate.

12. The ceramic substrate of claim 11, wherein the first sublayer has a thickness ranging from 0 micrometers (μm) to 0.4 μm.

13. The ceramic substrate of claim 11, wherein the second sublayer has a thickness ranging from 1 μm to 18 μm.

14. The ceramic substrate of claim 11, wherein the third sublayer has a thickness ranging from 1 μm to 4 μm.

15. The ceramic substrate of claim 11, wherein the fourth sublayer has a thickness ranging from 0.1 μm to 0.5 μm.

* * * * *